United States Patent
Uehira

[11] Patent Number: 5,091,922
[45] Date of Patent: Feb. 25, 1992

[54] CHARGE TRANSFER DEVICE TYPE SOLID STATE IMAGE SENSOR HAVING CONSTANT SATURATION LEVEL

[75] Inventor: Kazuo Uehira, Tokyo, Japan
[73] Assignee: NEC Corporation, Japan
[21] Appl. No.: 373,397
[22] Filed: Jun. 30, 1989

[30] Foreign Application Priority Data
Jun. 30, 1988 [JP] Japan .................. 63-164313

[51] Int. Cl.$^5$ .................. H01L 29/78; G11C 19/28; H04N 3/14
[52] U.S. Cl. .................. 377/58; 377/60; 377/62; 357/24; 358/213.19
[58] Field of Search .................. 377/57–64; 357/24, 24 LR; 358/213.19, 213.23, 213.29, 213.24, 213.26

[56] References Cited

U.S. PATENT DOCUMENTS

| | | | |
|---|---|---|---|
| 3,919,564 | 11/1975 | Walden | 377/63 |
| 4,040,076 | 8/1977 | Kosonocky et al. | 377/58 |
| 4,191,895 | 3/1980 | Levine et al. | 377/58 |
| 4,660,064 | 4/1987 | Hamasaki | 377/60 |
| 4,694,476 | 9/1987 | Oda | 377/58 |
| 4,733,406 | 3/1988 | Kinoshita et al. | 377/58 |
| 4,819,072 | 4/1989 | Boucharlat et al. | 358/213.29 |
| 4,884,142 | 11/1989 | Suzuki | 358/213.19 |
| 4,885,626 | 12/1989 | Coutures | 377/58 |
| 4,975,777 | 12/1990 | Lee et al. | 358/213.19 |

FOREIGN PATENT DOCUMENTS
0025801 2/1980 Japan .................. 377/57

Primary Examiner—Stanley D. Miller
Assistant Examiner—Tai V. Duong
Attorney, Agent, or Firm—Laff, Whitesel, Conte & Saret

[57] ABSTRACT

A horizontal transfer shift register is formed on a semiconductor substrate for use in a solid state image sensor of the charge transfer device type. The horizontal transfer shift register is coupled to receive electric charge signals in parallel and operates to serially transfer the received electric charge signals to an signal output circuit. The horizontal transfer shift register comprises a plurality of horizontal transfer electrodes formed on the substrate, a control electrode formed on the substrate adjacent to a horizontal transfer electrode adjacent to the signal output circuit, and a drain diffusion region formed in the substrate adjacent to the control electrode. When a predetermined potential is applied to the control electrode, a portion of electric charge which should be accumulated under the horizontal transfer electrode adjacent to the signal output circuit is discharged to the drain diffusion region, so that the electric charge signal will not exceed a saturation level determined by the predetermined potential applied to the control electrode.

4 Claims, 3 Drawing Sheets

CHARGE TRANSFER DEVICE TYPE SOLID STATE IMAGE SENSOR HAVING CONSTANT SATURATION LEVEL

BACKGROUND OF THE INVENTION

1. Field of the Invention

The present invention relates to a solid state image sensor, and more particularly, to such a sensor having a reading mechanism of the charge transfer device type such as a charge coupled device (called "CCD" in this specification).

2. Description of Related Art

At present, a solid state image sensor using a charge coupled device (called "CCD image sensor" hereinafter) is being reduced into practice as an imaging means for a video camera. Referring to FIG. 1, there is shown a layout pattern of a typical conventional CCD image sensor. The shown CCD image sensor comprises a semiconductor substrate 10 of a given conduction type, on which a number of photo-electric converting elements (not shown) are arranged in the form of a matrix having a plurality of rows and a plurality of columns. Each column of photoelectric converting elements is associated with a vertical transfer register composed of a CCD device so that electric signals outputted from the respective photo-electric converting elements are transferred in parallel to the associated vertical transfer CCD device. In FIG. 1, for simplification of the drawing, only a portion of one vertical transfer register is shown. In the shown example, the vertical transfer CCD device includes a plurality of first vertical transfer electrodes 12 and a plurality of second vertical transfer electrodes 14, which are formed through an insulating layer on the semiconductor substrate 10, and alternately arranged in a regularly repeated pattern in the vertical direction along the associated photo-electric converting element column. The first vertical transfer electrodes 12 and the second vertical transfer electrodes 14 partially overlap with one another in the plan view, but are electrically isolated from one another. In the case of a two-phase drive, a first pair of the first vertical transfer electrode 12 and the second vertical transfer electrode 14 adjacent to each other are applied with a first vertical transfer clock, and a second pair of the first vertical transfer electrodes 12 and the second vertical transfer electrodes 14, which are adjacent to each other and are positioned at each side of the first pair of vertical transfer electrodes, are applied with a second vertical transfer clock opposite in phase to the first vertical transfer clock, so that an electric charge is transferred along an array of the first vertical transfer electrodes 12 and the second vertical transfer electrodes 14 with application of the first and second vertical transfer clocks.

A termination of each vertical transfer CCD device is coupled to a corresponding stage of a horizontal transfer register, which is in turn composed of a CCD device. In FIG. 1, only a portion of one horizontal transfer register is shown also for simplification of the drawing. In the shown example, the horizontal transfer CCD device includes a plurality of first horizontal transfer electrodes 16 and a plurality of second horizontal transfer electrodes 18 which are formed through an insulating layer on the semiconductor substrate 10, and alternately arranged in a regularly repeated pattern in the horizontal direction perpendicular to the vertical transfer CCD device. The first horizontal transfer electrodes 16 and the second horizontal transfer electrodes 18 partially overlap with one another in the plan view, but are electrically isolated from one another. In the case of a two-phase drive, a first pair of the first horizontal transfer electrode 16 and the second horizontal transfer electrode 18 adjacent to each other are applied with a first horizontal transfer clock, and a second pair of the first horizontal transfer electrodes 16 and the second horizontal transfer electrodes 18, which are adjacent to each other and are positioned at each side of each first pair of horizontal transfer electrodes, are applied with a second horizontal transfer clock opposite in phase to the first horizontal transfer clock, so that an electric charge is transferred along an array of the first horizontal transfer electrodes 16 and the second horizontal transfer electrodes 18 with application of the first and second horizontal transfer clocks.

At an end of the horizontal transfer CCD device, there is formed an electric charge detection circuit, which includes a first output gate electrode 20 partially overlapping with the final horizontal transfer electrode of the horizontal transfer CCD device but electrically isolated from the final horizontal transfer electrode. A second output gate electrode 22 is further provided to partially overlap with the first output gate electrode 20 but to be electrically isolated from the first output gate electrode 20. In addition, an output transistor is formed adjacent to the second output gate electrode 22. This output transistor includes a first diffusion region 24 and a second diffusion region 26 formed in the substrate 10 separately from each other, and a reset or control electrode 28 formed between the first and second diffusion regions 24 and 26. With above arrangement, photo signals generated by the respective photo-electric converting elements arranged in the matrix are serially outputted from the output transistor.

On the other hand, in order to ensure that the CCD image sensor has a sufficient performance as an imaging means for a video camera, the CCD image sensor has to be composed of 300,000 or more picture elements, namely photo-electric converting elements. However, it is difficult to fabricate the 300,000 photo-electric converting elements perfectly identical to one another, because of dispersion in diffusion process. The larger the number of the photo-electric converting elements becomes, the greater the dispersion of the photo-electric converting elements also becomes. The dispersion of the photo-electric converting elements means that there is a dispersion in a saturation level of the photo-electric converting elements means. However, when the CCD image sensor is used in a video camera, the photo-electric converting elements will be used to be often brought into a saturation region or status. Therefore, if a sufficient amount of light to cause a group of photo-electric converting elements to saturate is inputted into the video camera, unevenness will appear in a saturated image portion because of the dispersion in the saturation level of the photo-electric converting elements. As a result, an image quality will be deteriorated. However, the conventional CCD image sensors used in the video camera have no means for restraining the dispersion in the saturation level of the photo-electric converting elements. Therefore, the CCD image sensor having the dispersion in the saturation level of the photo-electric converting elements must have been rejected as a defective. In other words, the production yield of the conventional CCD image sensors has been low.

As seen from the above, the conventional CCD image sensors have often deteriorate the image quality or have been low in yield of production.

SUMMARY OF THE INVENTION

Accordingly, it is an object of the present invention to provide a solid state image sensor of the charge transfer device type which has overcome the above mentioned defect of the conventional one.

Another object of the present invention is to provide a a solid state image sensor of the charge transfer device type having a constant saturation level.

The above and other objects of the present invention are achieved in accordance with the present invention by a horizontal transfer shift register formed on a semiconductor substrate for use in a solid state image sensor of the charge transfer device type, the horizontal transfer shift register being coupled to receive electric charge signals in parallel and operating to serially transfer the received electric charge signals to an signal output circuit, comprising a plurality of horizontal transfer electrodes formed on the substrate, a control electrode formed on the substrate adjacent to a horizontal transfer electrode adjacent to the signal output circuit, and a drain diffusion region formed in the substrate adjacent to the control electrode, so that when a predetermined potential is applied to the control electrode, a portion of electric charge which should be accumulated under the horizontal transfer electrode adjacent to the signal output circuit is discharged to the drain diffusion region, whereby the electric charge signal will not exceed a saturation level determined by the predetermined potential applied to the control electrode.

The above and other objects, features and advantages of the present invention will be apparent from the following description of preferred embodiments of the invention with reference to the accompanying drawings.

DESCRIPTION OF THE PREFERRED EMBODIMENTS

Figure 1:
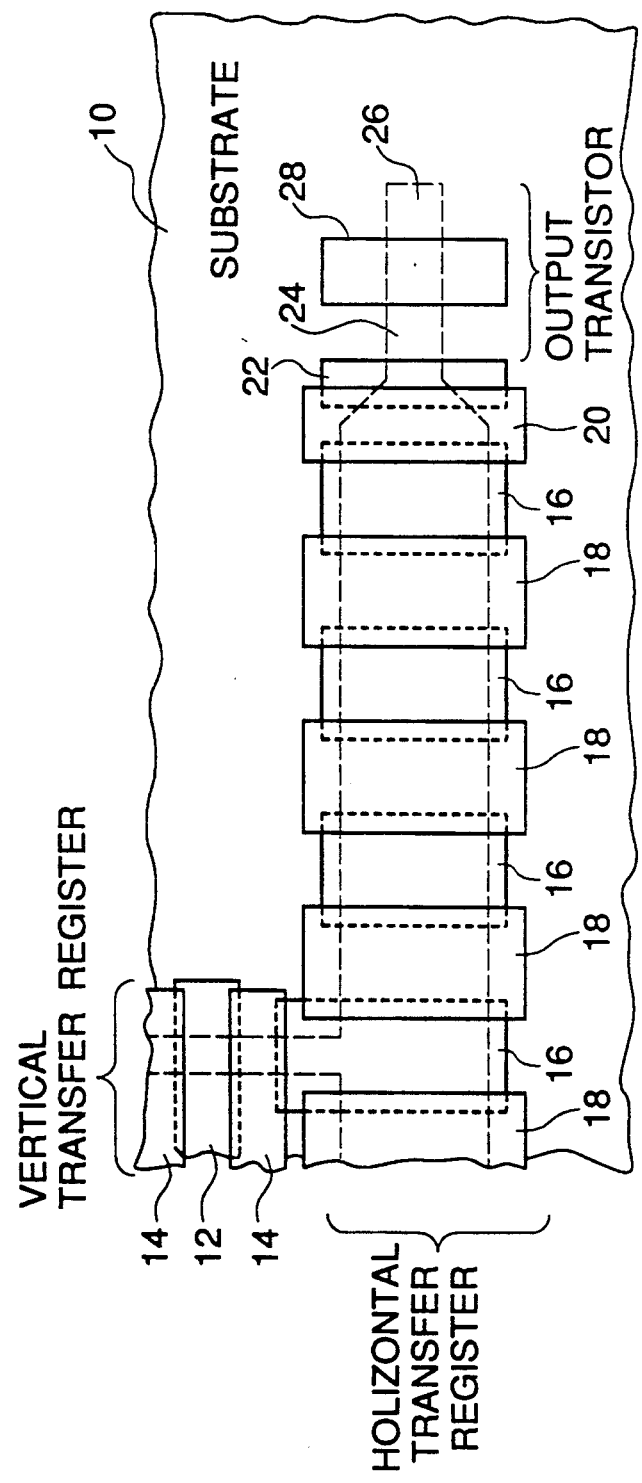
FIG. 1 illustrates a diagrammatic layout pattern of the typical conventional CCD image sensor.
Figure 2A:
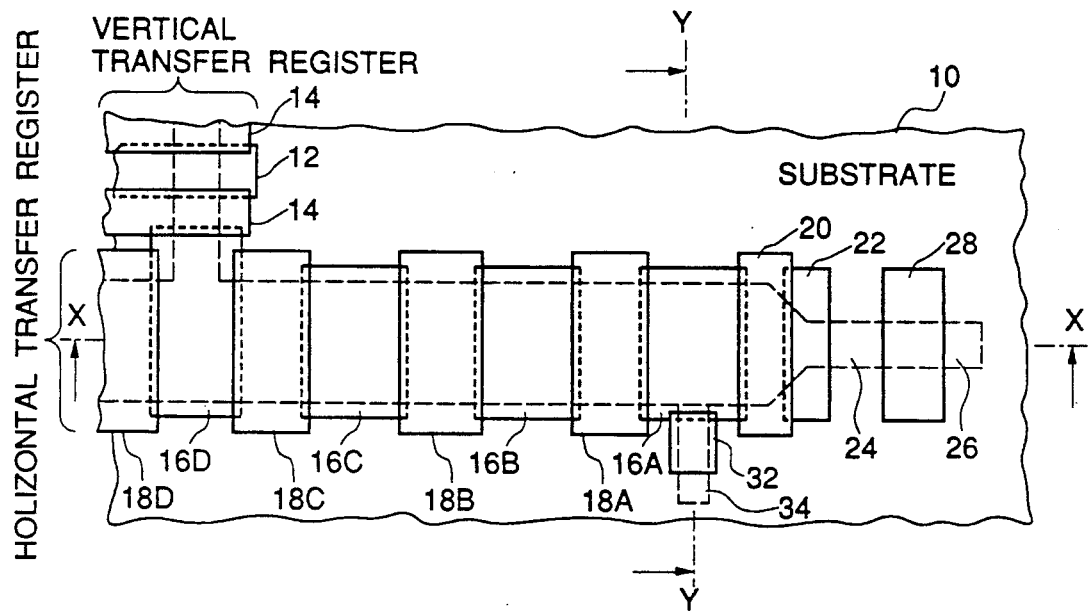
FIG. 2A illustrates a diagrammatic layout pattern of one embodiment of the CCD image sensor in accordance with the present invention.
Figure 2B:
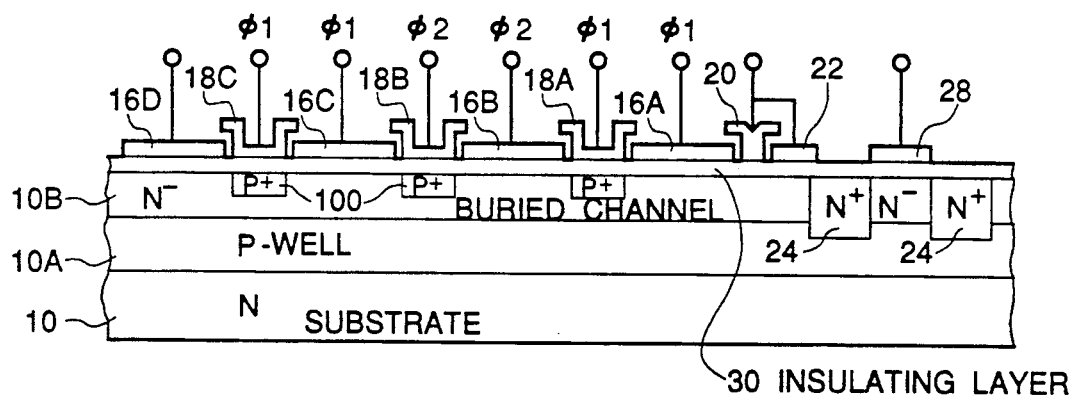
FIG. 2B is a sectional view taken along the line X—X in FIG. 2A.
Figure 2C:
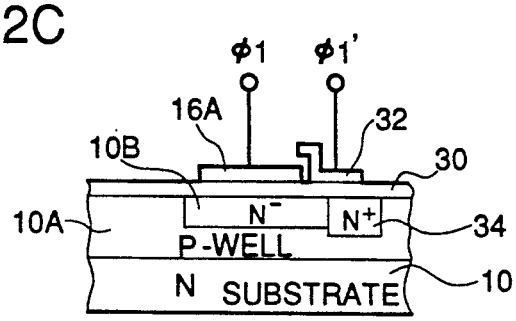
FIG. 2C is a sectional view taken along the line Y—Y in FIG. 2A.

Referring to FIG. 2A, there is shown a diagrammatic layout pattern of one embodiment of the CCD image sensor in accordance with the present invention. FIG. 2B is a sectional view taken along the line X—X in FIG. 2A, and FIG. 2C is a sectional view taken along the line Y—Y in FIG. 2A. In FIG. 2A, portions similar to those shown in FIG. 1 are given the same Reference Numerals.

The shown CCD image sensor comprises an N-type semiconductor substrate 10 having a P-type well 10A formed thereon and an N— buried channel layer 10B formed in the P-type well 10A to form an electric charge transfer path, as seen from FIGS. 2B and 2C. On the semiconductor substrate 10, a number of photo-electric converting elements (not shown) are arranged in the form of a matrix having a plurality of rows and a plurality of columns. Each column of photo-electric converting elements is associated with a vertical transfer register composed of a CCD device so that electric signals outputted from the respective photo-electric converting elements are transferred in parallel to the associated vertical transfer CCD device. The vertical transfer CCD device includes a plurality of first vertical transfer electrodes 12 and a plurality of second vertical transfer electrodes 14, which are arranged through an insulating layer 30 on and along the N— buried channel layer 10B. The first vertical transfer electrodes 12 and the second vertical transfer electrodes 14 are alternately arranged in a regularly repeated pattern in the vertical direction along the associated photo-electric converting element column. The first vertical transfer electrodes 12 and the second vertical transfer electrodes 14 partially overlap with one another in the plan view, but are electrically isolated from one another.

A termination of each vertical transfer CCD device is coupled to a corresponding stage of a horizontal transfer register, which is in turn composed of a CCD device. In FIG. 2A, only a portion of one horizontal transfer register is shown also for simplification of the drawing. The horizontal transfer CCD device is formed on and along the N— buried channel layer 10B, as seen from FIGS. 2B and 2C. A plurality of P+ diffusion regions 10D are formed in the N— buried channel layer 10B, at predetermined constant intervals, and separately from one another, as seen from FIG. 2B. In addition, a plurality of first horizontal transfer electrodes 16A, 16B, 16C, 16D, . . are formed through the insulating layer 30 on the semiconductor substrate 10 so that each of the first horizontal transfer electrodes 16A, 16B, 16C, 16D, . . . is positioned above an N— buried channel layer portion between each pair of adjacent P+ diffusion regions 10D. A plurality of second horizontal transfer electrodes 18A, 18B, 18C, 18D, . . . are formed through the insulating layer 30 on the semiconductor substrate 10 so that each of the second horizontal transfer electrodes 18A, 18B, 18C, 18D, . . . is positioned above one of the P+ diffusion regions 10D and partially overlaps with adjacent first horizontal transfer electrodes 16 in the plan view. As seen from FIGS. 2A and 2B, the first and second horizontal transfer electrodes 16A, 16B, 16C, 16D, . . . and 18A, 18B, 18C, 18D, . . . are alternately arranged in a regularly repeated pattern in the horizontal direction perpendicular to the vertical transfer CCD device, and are electrically isolated from one another.

At an end of the horizontal transfer CCD device, there is formed an electric charge detection circuit, which includes a first output gate electrode 20 formed on the N— buried channel layer 10B to partially overlap with the final horizontal transfer electrode 16A of the horizontal transfer CCD device but electrically isolated from the final horizontal transfer electrode 16A. A second output gate electrode 22 is further formed to partially overlap with the first output gate electrode 20 but to be electrically isolated from the first output gate electrode 20. In addition, an output transistor is formed adjacent to the second output gate electrode 22. This output transistor includes a first N+ diffusion region 24 and a second N+ diffusion region 26 formed to downwardly extend to the P-well 10A in the substrate 10 but horizontally separated from each other, and a reset or control electrode 28 formed above the N— channel 10B between the first and second diffusion regions 24 and 26.

Furthermore, in accordance with the present invention, a control electrode 32 is formed to partially overlap with the final first horizontal transfer electrode 16A adjacent to the first output gate electrode 20, and to extend in a direction perpendicular to the horizontal transfer direction. In addition, a drain N+ diffusion region 34 is formed adjacent to the N— buried channel 10A under the the final first horizontal transfer electrode 16A adjacent to the first output gate electrode 20. This N+ diffusion region 34 is positioned below the control electrode 32 and extends apart from the control electrode 32 in the vertical direction (perpendicular to the horizontal transfer direction).

Figure 3:
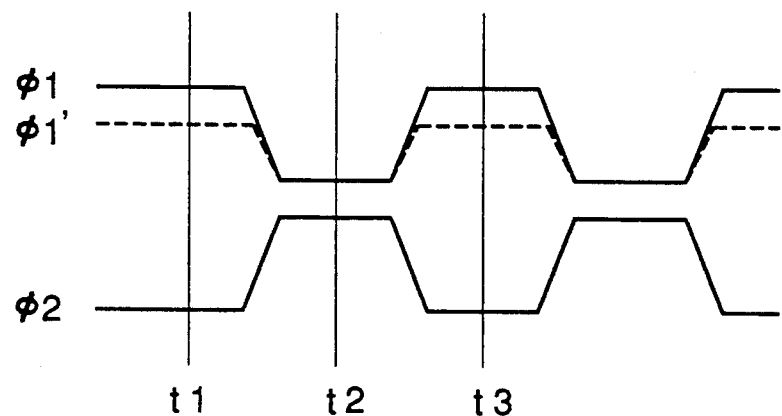
FIG. 3 is a waveform diagram illustrating the transfer clocks applied to the circuit shown in FIG. 2.

When the above mentioned horizontal transfer CCD device of the CCD image sensor is driven with two-phase clocks $\phi_1$ and $\phi_2$ as shown in FIG. 3, each first pair of the first horizontal transfer electrode 16A (16C) and the second horizontal transfer electrode 18A (18C) adjacent to each other are applied with a first horizontal transfer clock $\phi_1$, and each second pair of the first horizontal transfer electrodes 16B (16D) and the second horizontal transfer electrodes 18B (18D), which are adjacent to each other and are positioned at each side of each first pair of horizontal transfer electrodes, are applied with a second horizontal transfer clock $\phi_2$ opposite in phase to the first horizontal transfer clock $\phi_1$. In addition, the control electrode 32 is applied with a control clock $\phi_{1'}$ which is in the same phase as the clock $\phi_1$, but whose level is lower than that of the clock $\phi_1$, as shown in FIG. 3. For example, the level of the control clock $\phi_{1'}$ is set to a potential corresponding to 90% of an averaged saturation level of the photo-electric converting elements.

Figure 4A:
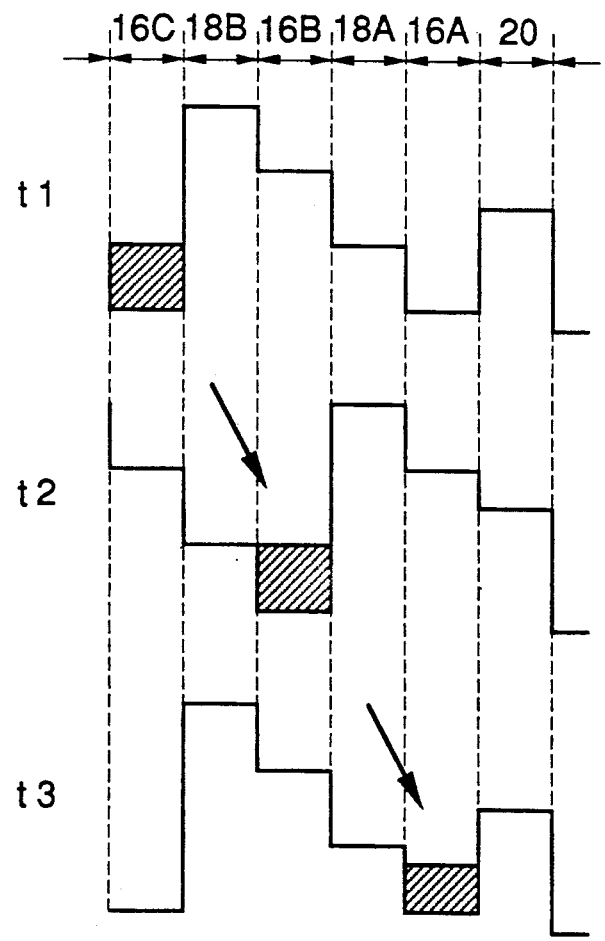
FIGS. 4A and 4B illustrate potential levels of various portions shown in FIG. 2A.
Figure 4B:
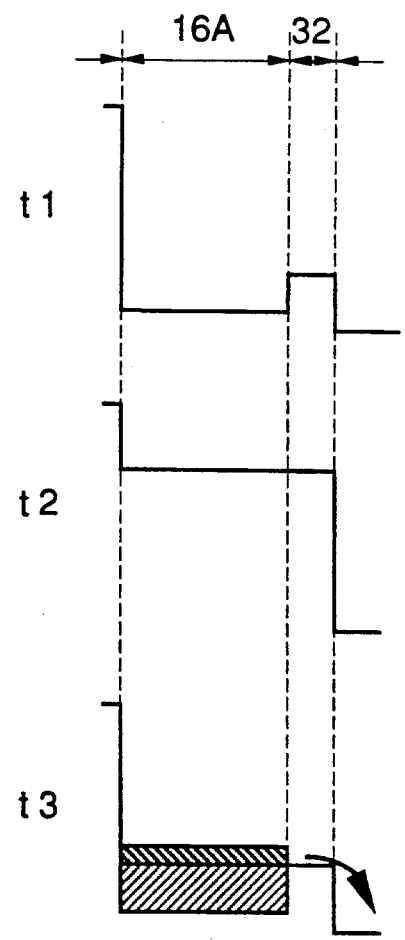

Now, operation will be explained with reference to FIGS. 4A and 4B illustrating potential distributions under the respective electrodes. Assume that an electric charge is accumulated under the electrode 16C at a timing $t_1$, and no electric charge is then accumulated under the electrode 16A. At this time $t_1$, the potential level under the control electrode 32 applied with the control clock $\phi_{1'}$ is higher than that of the final first horizontal electrode 16A applied with the clock $\phi_1$, as shown in FIG. 4B. At a next timing $t_2$, the electric charge is transferred under the electrode 16B as shown in FIG. 4A. At this time $t_2$, the potential level under the control electrode 32 applied with the control clock $\phi_{1'}$ is the same as that of the final first horizontal electrode 16A applied with the clock $\phi_1$, as shown in FIG. 4B. Thereafter, at a timing $t_3$, the electric charge is transferred under the final first transfer electrode 16A as shown in FIG. 4A. However, the electric charge transferred under the electrode 16A is accumulated only to a potential determined by the control electrode 32, and the electric charge exceeding the potential determined by the control electrode 32 will overflow through the control electrode 32 to the drain diffusion region 34. In other words, only the electric charge of the amount limited by the control electrode 32 is accumulated under the final first horizontal electrode 16A, and therefore, outputted to the output circuit. As mentioned above, since the control clock $\phi_{1'}$ applied to the control electrode 32 corresponds to 90% of the averaged saturation level of the photo-electric converting elements, even if there is dispersion on the saturation level of the photo-electric converting elements, all the output photo-electric signals will have the saturation level corresponding to 90% of the averaged saturation level of the photo-electric converting elements.

A photo-electric signal generated by any photo-electric converting elements within the CCD image sensor will picked up through the horizontal transfer CCD device, particularly through the final first transfer electrode 16A. Therefore, the saturation level of all the photo-electric signals will be apparently made to the same level determined by the control clock $\phi_{1'}$ applied to the control electrode 32. Accordingly, by suitably setting the level of the control clock $\phi_{1'}$, it is possible to completely remove the unevenness in a highlight portion of the picked up image, regardless of the dispersion of the saturation level of the photo-electric converting elements. Therefore, the image quality is improved, and the production yield of the CCD image sensors is increased.

The above embodiment has been directed to a two-dimensional image sensor. However, it will be apparent that the present invention can be applied to a linear image sensor.

The invention has thus been shown and described with reference to the specific embodiments. However, it should be noted that the present invention is in no way limited to the details of the illustrated structures but changes and modifications may be made within the scope of the appended claims.

I claim:

1. A charge transfer device type solid state image sensor having a constant saturation level, the charge transfer device type solid state image sensor including an array of photo-electric converting elements formed on a semiconductor substrate, a shift register formed on said semiconductor substrate, and means for controlling transfer of photo-electric conversion electric charge signals from said photo-electric converting elements to said shift register, said shift register operating to serially transfer the received electric charge signals to a signal output circuit, said shift register comprising a plurality of transfer electrodes formed on the substrate, a control electrode formed on the substrate adjacent to a last transfer electrode of said plurality of transfer electrodes adjacent to the signal output circuit, and a drain diffusion region formed in the substrate adjacent to the control electrode, so that when a predetermined potential having a same phase with the predetermined potential applied to the last transfer electrode is applied to the control electrode, a portion of electric charge which should be accumulated under the last transfer electrode adjacent to the signal output circuit is discharged to the drain diffusion region, whereby the electric charge signal will not exceed a saturation level determined by the predetermined potential applied to the control electrode.

2. A charge transfer device type solid state image sensor having a constant saturation level, the charge transfer device type solid state image sensor including a matrix of photo-electric converting elements formed on a semiconductor substrate, a plurality of vertical shift registers formed on said semiconductor substrate, each of said vertical shift registers being located along a corresponding column of photo-electric converting elements in said photo-electric converting element matrix so as to receive photo-electric conversion electric charge signals from said corresponding column of photo-electric converting elements and to transfer said received photo-electric conversion electric charge signals along the vertical shift register, and a horizontal transfer shift register formed on said semiconductor substrate said horizontal transfer shift register being coupled in parallel to output ends of said vertical shift registers to receive said photo-electric conversion electric charge signals in parallel and operating to serially transfer the received electric charge signals to a signal output circuit, said horizontal transfer shift register comprising a plurality of horizontal transfer electrodes formed on the substrate, a control electrode formed on the substrate adjacent to a last horizontal transfer electrode of said plurality of horizontal transfer electrodes adjacent to the signal output circuit, and a drain diffusion region formed in the substrate adjacent to the control electrode, so that when a predetermined potential having a same phase with the predetermined potential applied to the last horizontal transfer electrode is applied to the control electrode, a portion of electric charge which should be accumulated under said last horizontal transfer electrode adjacent to the signal output circuit is discharged to the drain diffusion region, whereby the electric charge signal will not exceed a saturation level determined by the predetermined potential applied to the control electrode.

3. A horizontal transfer shift register in claim 2 wherein the horizontal transfer shift register includes a plurality of first horizontal transfer electrodes and a plurality of second horizontal transfer electrodes which are formed through an insulating layer on the semiconductor substrate, and alternately arranged in a regularly repeated pattern in a horizontal direction, wherein the signal output circuit includes a first output gate electrode partially overlapping with a final horizontal transfer electrode of the horizontal transfer shift register but electrically isolated from the final horizontal transfer electrode, a second output gate electrode provided to partially overlap with the first output gate electrode but to be electrically isolated from the first output gate electrode, and an output transistor is formed adjacent to the second output gate electrode, and wherein the control electrode is formed to extend in a direction perpendicular to the horizontal direction and the drain diffusion region is formed to extend apart from the control electrode in the direction perpendicular to the horizontal direction.

4. A horizontal transfer shift register in claim 3 wherein the horizontal transfer shift register is of the charge coupled device and wherein the first horizontal transfer electrodes and the second horizontal transfer electrodes are formed through an insulating layer on the semiconductor substrate and to extend above a channel layer for the charge coupled device formed in the semiconductor substrate, the drain diffusion region being formed tangent to the channel layer under the final horizontal transfer electrode of the horizontal transfer shift register.

* * * * *